United States Patent [19]

Burns

[11] 4,355,463
[45] Oct. 26, 1982

[54] PROCESS FOR HERMETICALLY ENCAPSULATING SEMICONDUCTOR DEVICES

[75] Inventor: Carmen D. Burns, San Jose, Calif.

[73] Assignee: National Semiconductor Corporation, Santa Clara, Calif.

[21] Appl. No.: 133,053

[22] Filed: Mar. 24, 1980

[51] Int. Cl.³ .............................................. H01R 43/02
[52] U.S. Cl. .......................................... 29/827; 29/413; 174/52 FP; 357/70; 357/81
[58] Field of Search ........................ 357/72, 81, 80, 70, 357/71; 29/412, 413, 414, 846, 827, 847, 576 S; 174/52 FP, 52 PE

[56] References Cited

U.S. PATENT DOCUMENTS

| | | | |
|---|---|---|---|
| 3,271,625 | 9/1966 | Caracciolo | 357/72 X |
| 3,374,537 | 3/1968 | Doelp, Jr. | 357/70 X |
| 3,546,543 | 12/1970 | Hessinger | 174/52 FP X |
| 4,209,355 | 6/1980 | Burns | |
| 4,243,495 | 1/1981 | Trott | 29/413 X |

Primary Examiner—Francis S. Husar
Assistant Examiner—Carl J. Arbes
Attorney, Agent, or Firm—Gail W. Woodward; James A. Sheridan; Neil B. Schulte

[57] ABSTRACT

A tape assembly process attaches semiconductor chips to a tape via thermocompression gang bonding and the tape is wound onto a reel. The tape is fabricated during its manufacture to have a plurality of spaced finger array patterns. The inner finger ends are located so as to mate with the bonding pads of a semiconductor device and are bonded thereto. A ring-shaped strip is included in each finger pattern that joins all of the fingers in each pattern into a unitary structure in which the fingers are accurately spaced. Where the ring joins onto the fingers, weakened regions are introduced and the side of the tape that contains the semiconductor device includes a recess that is in registry with the ring. A ceramic substrate that will ultimately mount the semiconductor device is provided with an array of conductor patterns that match the tape finger patterns. A layer of sealing glass is screened over the ceramic, so as to align with the ring. Then the tape fingers are thermocompression bonded to the metal pattern, so that a bond is created for each finger on both sides of the glass. The ring is then mechanically stripped away with the weakened regions determining where the metal will rupture. This leaves a finger element on each side of the glass ring with the underlying conductor providing electrical continuity. The glass ring can then be joined to a ceramic cover that has a matching glass ring. The assembly is heat sealed to provide a hermetic housing.

10 Claims, 7 Drawing Figures

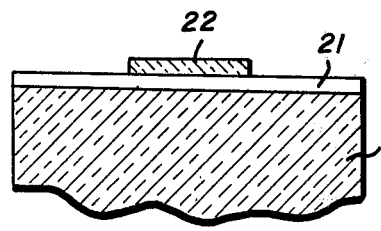
Fig_1
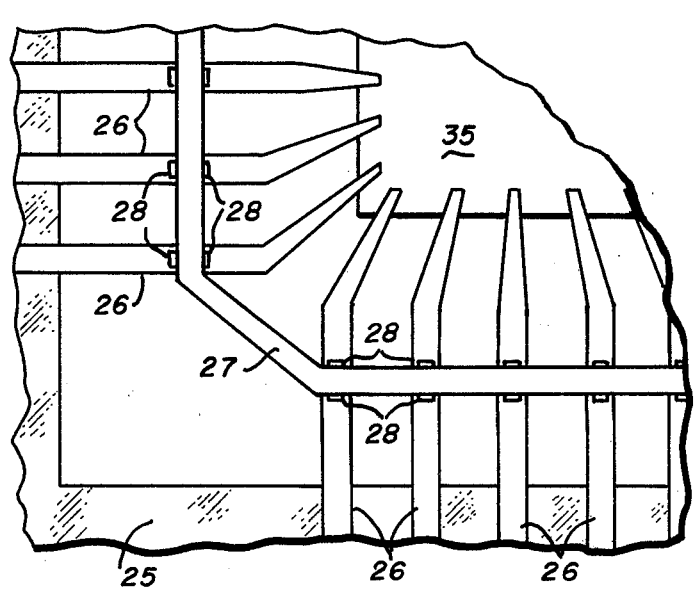
Fig_2
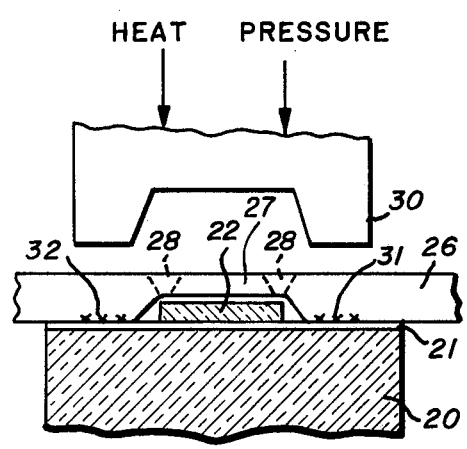
Fig_3
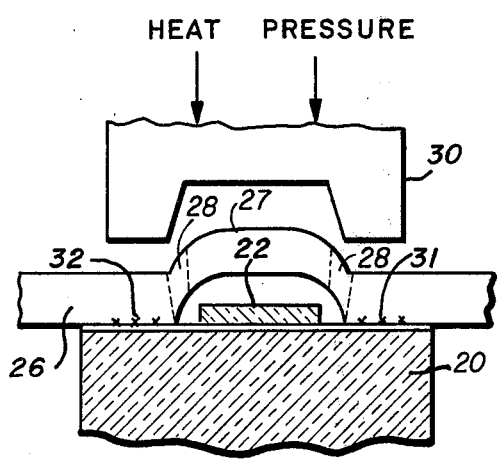
Fig_4
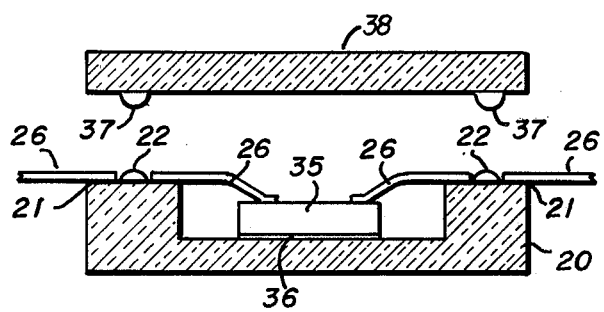
Fig_5

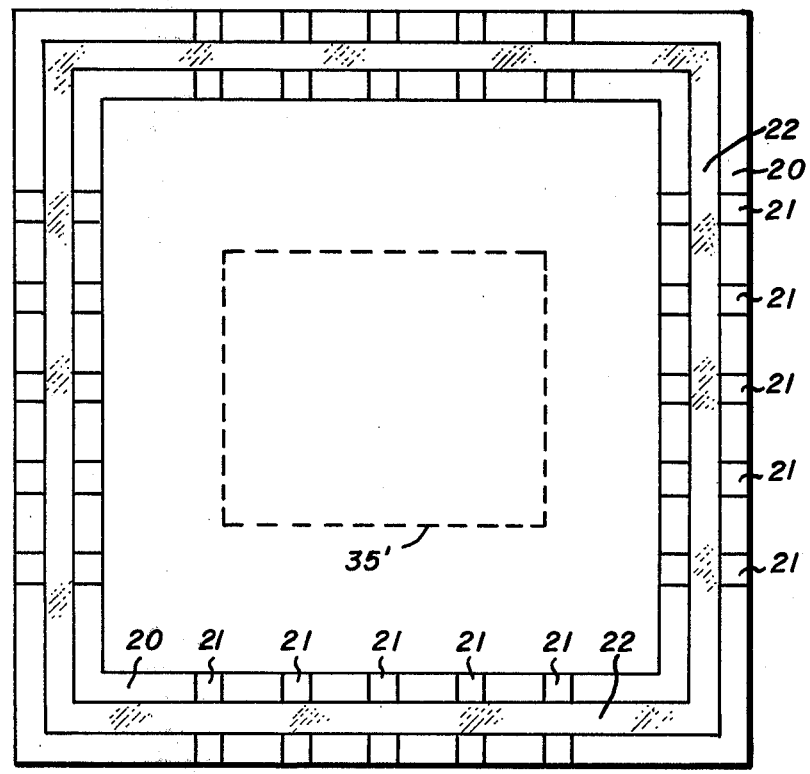
Fig_6
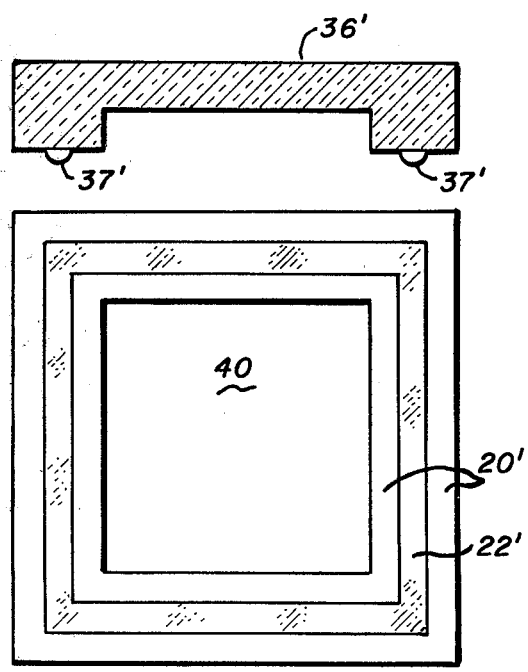
Fig_7

PROCESS FOR HERMETICALLY ENCAPSULATING SEMICONDUCTOR DEVICES

BACKGROUND OF THE INVENTION

Tape assembly processes have been disclosed in my U.S. Pat. Nos. 4,000,842 and 4,188,438 as well as in my publication titled "TRENDS IN TAPE BONDING", in the April 1979 issue of SEMICONDUCTOR INTERNATIONAL. My copending patent application Ser. No. 921,642, filed July 3, 1978, is titled "CONTROLLED COLLAPSE THERMOCOMPRESSION GANG BONDING." My copending patent application Ser. No. 921,643, filed July 26, 1978, is titled "MANUFACTURE OF BUMPED COMPOSITE TAPE FOR AUTOMATIC GANG BONDING OF SEMICONDUCTIVE DEVICES" now U.S. Pat. No. 4,209,355 which issued June 24, 1980. In these prior art references, a tape assembly process is detailed wherein a metal or composite metal-insulator tape is manufactured to have a plurality of metal finger patterns. The inner portion of the fingers is configured to mate with the contact pads of a semiconductor chip and are thermocompression gang bonded thereto. The chip is thus mechanically associated with the tape which can be handled automatically on reel-to-reel assembly machines. In my application, Ser. No. 921,642, the metal tape fingers are provided with bumps that permit attachment to a conventional integrated circuit (IC) chip, so that the semiconductor devices do not require bumps which impose special fabrication steps.

Typically, the tape mounted chips are run through a process in which the chips are either bonded to a lead frame and encapsulated or they are encapsulated directly with the protruding metal finger portions providing external leads. In either case, transfer molded encapsulants are preferred. While useful, this molding process has proven to be slow and the tape is commonly cut up into suitable lengths for batch encapsulation. In my copending patent application Ser. No. 133,040 filed Mar. 24, 1980, and titled TAPE OPERATED SEMICONDUCTOR DEVICE PACKAGING, a process is described where the tape assembly approach is applied through the encapsulation of the semiconductor devices. However, the final device is plastic encapsulated.

SUMMARY OF THE INVENTION

It is an object of the invention to provide hermetic housings for semiconductor devices.

It is a further object of the invention to hermetically seal a semiconductor in a tape assembly process.

It is a still further object of the invention to employ a ceramic housing with a final glass seal to hermetically seal tape assembled semiconductor devices.

These and other objects are achieved, starting with a tape which has bonded thereto semiconductor devices, in accordance with well known prior art techniques. However, in the manufacture of the tape, a special ring is added to the conventional metal finger patterns that serve as leads. The ring is located to be in registry with the region of the ultimate glass hermetic seal. Where the ring intersects each finger, a region of reduced strength is created. Also, each finger includes a region of reduced thickness or a mechanical arch in registry with the ring.

A ceramic part is created to become part of the hermetic housing. This ceramic part is provided with an array of conductive patterns that mate with the tape finger pattern in the ultimate seal region. These conductive patterns are long enough to span the metal ring and are intimately bonded to the ceramic. Then a sealing glass bead is applied to the ceramic over the conductor pattern in the form of a ring. The tape fingers are aligned with the ceramic, so that the metal ring lies over the glass ring and the fingers are bonded to the conductor pattern at two points, one on each side of the glass bead. If desired, the semiconductor device can also be bonded to the ceramic. At this point, the metal ring is stripped away from the assembly with the weakened regions determining the points of tear away. This leaves the semiconductor device contacts connected to the inner portions of the conductive pattern and an outer portion that extends beyond the edge of the ceramic. The glass bead lies over that portion of the conductive pattern that connects the outer finger positions to the inner finger portions. A ceramic cap is prepared having a face that mates with the first ceramic and it includes a glass sealing bead that mates with the first glass bead. The assembly is then heat and pressure sealed to unite the glass beads and hence the ceramic parts. If desired, the glass beads can be formed of a devitrifying solder glass so that after sealing a ceramic-like joint is achieved.

BRIEF DESCRIPTION OF THE DRAWING

FIG. 1 is a cross section of a ceramic base with a conductor thereon and a glass bead over the conductor;

FIG. 2 shows a fragment of a composite metal-insulator tape, showing a portion of a finger pattern connected to a semiconductor chip;

FIG. 3 is a cross section of the region where a metal finger is etched and thermocompression bonded to the conductor on the ceramic;

FIG. 4 is an alternative to FIG. 3, wherein the metal finger is mechanically deformed;

FIG. 5 is a cross section of a ceramic housing just prior to the hermetic seal;

FIG. 6 is a top view of the bottom element of FIG. 4, showing the conductor pattern and the glass bead; and FIG. 7 shows an alternative structure, wherein the cap has a recess and the base is a plane surface (with the conductor pattern omitted).

DESCRIPTION OF THE INVENTION

The starting point is a reel of assembly tape having a plurality of semiconductor devices bonded thereto. For example, see my U.S. Pat. No. 4,209,355. It is preferred that the devices be bonded to bumped tape, as disclosed in my application Ser. No. 921,642, filed July 3, 1978. I prefer to use 2.7 mil thick copper conductor, having a thin layer of nickel on the surface that does not bond.

The semiconductor devices on the copper tape are to be encapsulated inside a housing that is regarded as hermetically sealed. Typically, such a seal involves parts made of a ceramic that are joined by means of a glass composition, usually a devitrifying solder glass. The final seal is made so that the glass devitrifies and closes the package at a relatively low temperature. The sealed product will then withstand temperatures in excess of the sealing temperature with no softening of the seal glass.

With reference to FIG. 1, a ceramic substrate 20 is provided with an array of conductor patterns shown at 21. The array is configured to mate with the metal finger pattern on a tape carrier system to be described in greater detail hereinafter. The conductors can be either glass based conductive thick films or the well-known moly-manganese with a plated metal overcoat. In either approach, the desired pattern is screened onto the ceramic and fired to create the conductive film. The ceramic based part is provided with a layer of sealing glass at 22. This glass is screened on the form of a continuous ring that represents the final seal.

FIG. 2 shows a segment of a tape of the composite variety. A conductor pattern is located on a polymer film 25 that has a central opening into which the metal pattern extends in the form of an array of fingers 26 cantilevered from the composite structure. The fingers 26 terminate in the central region to form a pattern that mates with the pads on an IC 35 that is to be encapsulated. The fingers are all joined together by means of metal strip 27. Where strip 27 joins fingers 26, a weakened or cutaway region 28 is present. While a rectangular slit is shown, other shapes can be employed. In the all metal tape version a similar outline would be present. However, where FIG. 2 shows an insulator at 25 a metal surface would be present.

As shown in FIG. 3, the metal finger 26 is thermocompression bonded to the conductor pattern 21. Bonding tool 30 is configured to have a pair of bonding rings, as shown. This will provide a pair of bonds 31 and 32 on each finger, one on each side of glass 22. During tape manufacture, the metal finger is either etched to provide a cavity, as shown, or it is deformed mechanically to clear glass 22. The bonds follow the ring of glass 22, so that each finger is bonded twice, one each at 32 and 31 on each conductor 21. While a single gang bonding tool 30 is shown having a pair of ridges that provide the bonds 31 and 32, a single pointed tool could be used to create the individual finger bonds sequentially.

FIG. 4 shows an alternative construction to that of FIG. 3. Instead of etching a hollow clearance into finger 26, it is mechanically deformed, as shown. Bonding tool 30 spans the raised portion and creates the bonds at 31 and 32, as described above.

FIG. 5 shows a ceramic base 20, having a cup shaped depression. Semiconductor device 35, which is bonded to leads 26, is carried via the tape and secured at 36 by either solder or conductive epoxy. Then tool 30 bonds the fingers 26 as described above. The ceramic 20 is now joined to the tape. At this point, strip 27 is mechanically removed by tearing it off. The points of tear are defined by openings 28, so that strip 27 can be cleanly and easily removed. This exposes glass 22, as shown in FIG. 5. Here the glass is shown in rounded form, which would develop from the flat screened glass, shown in FIGS. 1 and 3, after heating to fusion temperature. A companion ceramic piece 38, which has a glass ring 37 thereon, to physically match glass 22 is then pressed against ceramic piece 20 and the assembly heated to sealing and devitrifying temperature. For example, using conventional Corning pyroceram solder glass, ceramic 20 can be heated to 250° C. while ceramic 36 is heated to 450° C. to 500° C. When the parts are pressed together, the heat is maintained until the glass devitrifies to form a ceramic joint between parts 20 and 36. Such a seal is hermetic.

FIG. 6 shows a top view of ceramic 20 with its plurality of conductive patterns 21 and glass ring 22. The dashed line at 35' represents where the semiconductor chip will be located. This area could be metallized if desired. As shown in FIG. 7, which omits the conductor pattern, the top cap 36' can be recessed as well as base 20' to create a hollow shell. Alternatively, with reference to FIG. 7, the base 20' can be flat with a metallized attachment region at 40 for mounting chip 35. This structure requires a cup-shaped cap, such as the one shown at 36' with a recess deep enough to accommodate the semiconductor chip.

If desired, the step of bonding the semiconductor device to the ceramic can be omitted. Regardless of the exact structure, the process results in a series of hermetically sealed semiconductor devices attached to the tape. The finished product can be excised from the tape and the leads formed to permit its application to a printed circuit board or hybrid substrate. Where the semiconductor device is bonded to the ceramic inside the package, an external heat sink can be secured to the package exterior to improve the device thermal performance.

If a composite tape is employed, as disclosed in my U.S. Pat. No. 4,209,355, the metal pattern can be configured to permit testing of the assembled devices in tape form. Thus the good devices can be identified before any further activity.

The invention has been described and, if read by a person skilled in the art, the foregoing description will suggest alternatives and equivalents that are within the spirit and intent of the invention. Accordingly, it is intended that the scope of the invention be limited only by the claims that follow.

I claim:

1. A tape assembly process for hermetically encapsulating semiconductive devices secured to a tape having a plurality of fingers defining a plurality of metal finger patterns, one pattern each for each semiconductive device, said finger patterns including an inner end arrayed to conform with the contact pads of the semiconductive device which is secured thereto, said process comprising the steps:

applying a series of conductive patterns around the periphery of a first ceramic part that is to become a portion of a housing for said semiconductive device, said conductive patterns being arrayed so that individual conductors register with said fingers in said finger patterns and radiate outward toward an outer edge of said first ceramic part;

applying a first ring of sealing glass over said conductive patterns so as to lie wholly within said conductive patterns which thereby extend on both sides of said first ring;

forming a metal ring on said metal finger pattern, thereby to mechanically join the fingers thereof together in each successive pattern on said tape, said metal ring having regions of mechanical weakness where it joins each finger and being shaped so as to conform with said first glass ring;

aligning said first ceramic part with respect to said tape so that said first glass ring is located in registry with said metal ring;

bonding said fingers in said patterns to said conductive patterns to secure adherence thereto, on both sides of said glass ring, whereby said metal ring lies over said glass ring;

removing said metal ring by stripping so as to break said regions of mechanical weakness, thereby exposing said first glass ring;

forming a second ceramic part that mates with said first ceramic part;

applying a second ring of sealing glass to the periphery of said second ceramic part to conform to said glass ring on said first ceramic part;

bringing said first and second ceramic parts together so that said first and second glass rings abut; and sealing said first and second ceramic parts together by means of said first and second glass rings.

2. The process of claim 1, wherein said first ceramic part includes a cup for accommodating said semiconductor device.

3. The process of claim 2 further including the step of securing said semiconductor device to the bottom of said cup.

4. The process of claim 1, wherein said first ceramic part is flat and said second ceramic part includes a cup to accommodate said semiconductor device.

5. The process of claim 4 further including the step of securing said semiconductor device to said first ceramic part.

6. The process of claim 1, wherein both said first and second ceramic parts are cup shaped to accommodate said semiconductor device.

7. The process of claim 1, further including the step of shaping said metal fingers so that they clear said first glass ring.

8. The process of claim 7, wherein said shaping is achieved by etching said fingers during the making of said tape.

9. The process of claim 7, wherein said shaping is achieved by mechanical deformation of said fingers.

10. The product manufactured by the process of claim 1.

* * * * *